United States Patent
Kokubo

(10) Patent No.: US 7,508,285 B2
(45) Date of Patent: Mar. 24, 2009

(54) BAND-PASS FILTER CIRCUIT

(75) Inventor: Masayuki Kokubo, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 11/812,710

(22) Filed: Jun. 21, 2007

(65) Prior Publication Data

US 2007/0296525 A1  Dec. 27, 2007

(30) Foreign Application Priority Data

Jun. 22, 2006  (JP) .............................. 2006-172128

(51) Int. Cl.
*H03H 7/00* (2006.01)
(52) U.S. Cl. ...................................... 333/175
(58) Field of Classification Search ................. 333/175, 333/176, 168
See application file for complete search history.

(56) References Cited

U.S. PATENT DOCUMENTS

| | | | | |
|---|---|---|---|---|
| 5,180,999 A | * | 1/1993 | Edwards | ...................... 333/175 |
| 5,625,894 A | * | 4/1997 | Jou | .............................. 455/78 |
| 5,917,387 A | * | 6/1999 | Rice et al. | .................... 333/174 |
| 6,734,759 B2 | * | 5/2004 | Humann | ...................... 333/167 |
| 6,882,246 B2 | * | 4/2005 | Marquardt et al. | .......... 333/174 |

FOREIGN PATENT DOCUMENTS

| | | |
|---|---|---|
| JP | 8-148958 | 6/1996 |
| JP | 2004-248121 | 9/2004 |
| JP | 2005-328262 | 11/2005 |

* cited by examiner

*Primary Examiner*—Benny Lee
*Assistant Examiner*—Alan Wong
(74) *Attorney, Agent, or Firm*—Young & Thompson

(57) ABSTRACT

A band pass filter circuit, wherein the band pass filter passes a frequency band between a first cutoff frequency and a second cutoff frequency with respect to an input frequency of an input signal, the band pass filter circuit includes: a first resonant circuit; a second resonant circuit; a third resonant circuit; at least one of a capacitive circuit and an inductive circuit. The first resonant circuit is connected to a signal line in series and sets a first resonant frequency as the first cutoff frequency. The second resonant circuit is connected to the signal line in series and sets a second resonant frequency as the second cutoff frequency. The third resonant circuit is connected to the signal line in parallel at a node where the first and second resonant circuits are connected, and sets a third resonant frequency as a band-pass center frequency between the first and second cutoff frequencies.

17 Claims, 9 Drawing Sheets

PRIOR ART

PRIOR ART

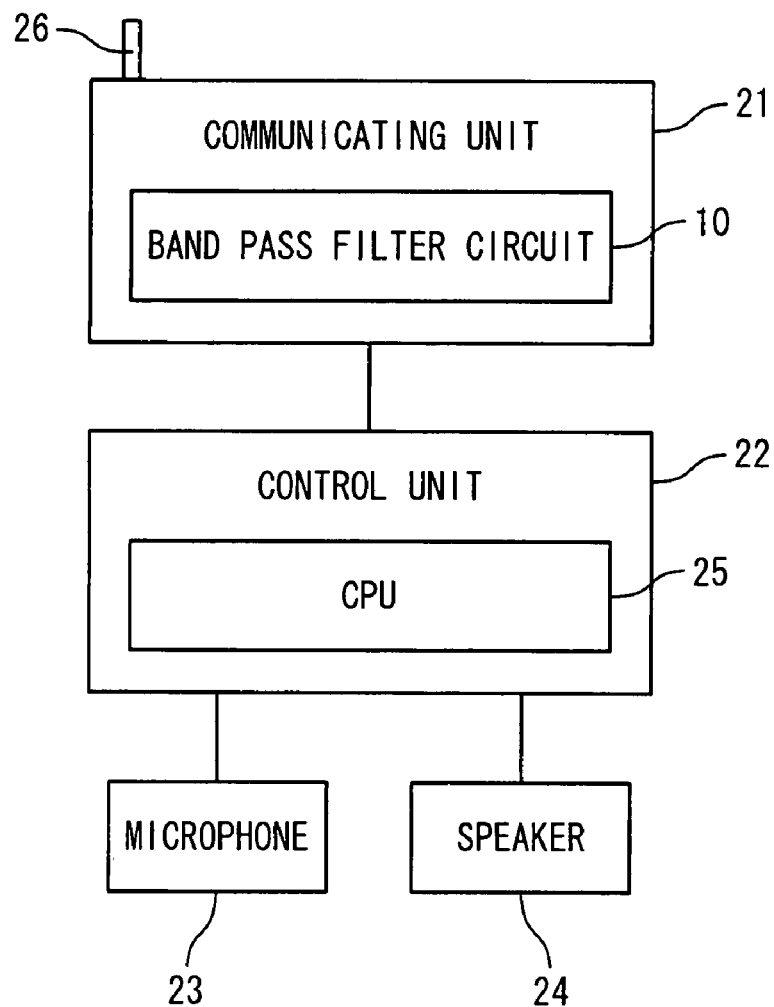

BAND-PASS FILTER CIRCUIT

BACKGROUND OF THE INVENTION

1. Field of the Invention

The present invention relates to a band-pass filter circuit that is installed in a communication device.

2. Description of Related Art

In recent years, as a communication device, a mobile phone using the frequencies of an 800 MHz band and a 2 GHz band has been popular. Also, as the communication device, a wireless LAN using the frequencies of a 2 GHz band and a 5 GHz band has been popular. So, in order to remove the frequency component, which is caused by noise and interference, from the input frequency of the input signal supplied to the communication device, the communication device includes a band-pass filter circuit. The band-pass filter circuit passes a passband including a band-pass center frequency with respect to the input frequency and cuts off a cutoff frequency band other than the passband. The band-pass filter circuit is especially required to exhibit a small loss (low insertion loss) in the pass characteristic when the band-pass center frequency is passed.

As a band pass filter circuit in a related art, Japanese Laid-Open Patent Application JP-P2004-248121A discloses a band pass filter. FIG. 1 shows the band pass filter circuit disclosed in this related art.

The band pass filter circuit includes: resonance lines 101, 102 in which one ends are grounded and they are coupled to each other and resonate at a band-pass center frequency; a parallel resonant circuit 111 connected between the other end of the resonance line 101 and an input end (a first port P1); and a parallel resonant circuit 112 connected between the other end of the resonance line 102 and an output end (a second port P2). Each of the parallel resonant circuits 111, 112 has an inductor and a capacitor that are connected in parallel to each other. This is characterized in that the resonant frequency of the parallel resonant circuits 111, 112 is set to be lower than the band-pass center frequency. Consequently, interference signals lower than the band-pass center frequency can be suppressed by the parallel resonant circuits 111, 112.

Moreover, according to the disclosed band pass filter circuit, a capacitor C101 is connected between the other ends of the resonance lines 101, 102. This is characterized in that the parallel resonant frequency, which results from the resonance lines 101, 102 and the capacitor C101, is set to be higher than the band-pass center frequency. Consequently, a pass bandwidth can be adjusted by the parallel resonant circuits 111, 112 and the capacitor C101.

In the band pass filter circuit, the resonance lines 101, 102 that resonate at the band-pass center frequency must be coupled to each other. For this reason, usually, it is not preferable that a line having a length of λ(lambda)/4 is drawn around, because an area of the circuit becomes large, especially in a several GHz band. If a spiral inductor and the like are used in order to make the area small, for example, the couplings must be performed in the upper and lower portions of a multilayer substrate.

In the disclosed band pass filter circuit, the resonance lines 101, 102 have the lengths that the resonance lines resonates at the band-pass center frequency. Thus, at the frequency higher than the parallel resonant frequency, which results from the resonance lines 101, 102 and the capacitor C101, the disclosed band pass filter circuit has a disadvantage that the impedance is high, the ground property is poor, and the strong attenuation is not obtained.

FIG. 2 is a view showing a propagation characteristic of the band pass filter circuit in the related art. In FIG. 2, insertion losses dB (S(2,1)) at the frequency of 1.8 GHz, 2.5 GHz and 3.5 GHz are represented by markers m13, m6 and m15, respectively. The insertion loss dB (S(2,1)) is represented as, for example, −20×log S(2,1) [dB] by using a band-pass characteristics S(2,1). The band-pass characteristics S(2,1) is represented as (Reflection electric power of second port P2)/(Input electric power of first port P1) when the input electric power of the second port P2 is assumed to be 0 (zero).

In the band pass filter circuit in the related art, the insertion loss of the band-pass center frequency of 2.5 GHz is 0.786 dB, the insertion loss of a lower cutoff frequency of 1.8 GHz is 67.1 dB, and the insertion loss of a higher cutoff frequency of 3.5 GHz is 24.1 dB. In addition, even in the other frequency bands, they are approximately 15 dB or more (−15 dB or less).

In this way, in the communication device that includes the band pass filter circuit, if the frequency component caused by the noise and the interference can be removed over that of the technique in the related art, the reliability on a communication is further improved. Thus, it is desired that the band pass filter circuit where the properties of the passband with a low insertion loss and the cutoff frequency band with a high isolation to be required are superior to the properties of the technique in the related art.

In addition to the above-mentioned related art, techniques in other related arts will be introduced below.

Japanese Laid-Open Patent Application JP-P 2005-328262 A describes a filter. In the filter, a plurality of parallel branch parts and a plurality of direct branch parts, which are constituted by resonant circuits, are alternately connected, and the resonant circuit of at least one direct branch part is configured such that two parallel resonant circuits are connected in series. The filter is characterized in that an inductive resonant circuit is installed between a conductor to connect the two parallel resonant circuits connected in series and a grounded conductor of the filter. Consequently, the influence caused by the capacitive component of the conductor to connect the two parallel resonant circuits is reduced in the filter.

Japanese Laid-Open Patent Application JP-A-Heisei, 8-148958 describes a filter circuit. The filter circuit is the Chebyshev-type filter circuit where a plurality of LC parallel resonant circuits are connected in parallel between an input terminal and an output terminal. The filter circuit is characterized in that at least one condenser to form a pole in an attenuation band is connected to a predetermined position. Consequently, the number of the inductances can be reduced, and the sharp attenuation characteristic can be obtained.

SUMMARY

The present invention seeks to solve one or more of the above problems, or to improve upon those problems at least in part. In one embodiment, a band pass filter circuit, wherein the band pass filter passes a passband which is a frequency band between a first cutoff frequency and a second cutoff frequency with respect to an input frequency of an inputted input signal, the band pass filter circuit includes: a first resonant circuit configured to be connected to a signal line in series and set a first resonant frequency as the first cutoff frequency; a second resonant circuit configured to be connected to the signal line in series and set a second resonant frequency as the second cutoff frequency; a third resonant circuit configured to be connected to the signal line in parallel at a connection node where the first resonant circuit and the second resonant circuit are connected, and set a third resonant frequency as a band-pass center frequency between the first cutoff frequency and the second cutoff frequency; and at least one of a capacitive circuit configured to be installed between the first resonant circuit and the connection node and an inductive circuit configured to be installed between the second resonant circuit and the connection node.

In another embodiment, a communication device includes: a communication unit configured to includes: a band pass filter circuit configured to pass a passband which is a frequency band between a first cutoff frequency and a second cutoff frequency with respect to an input frequency of an inputted input signal, and include: a first resonant circuit configured to be connected to a signal line in series and set a first resonant frequency as said first cutoff frequency, a second resonant circuit configured to be connected to said signal line in series and set a second resonant frequency as said second cutoff frequency, a third resonant circuit configured to be connected to said signal line in parallel at a connection node where said first resonant circuit and said second resonant circuit are connected, and set a third resonant frequency as a band-pass center frequency between said first cutoff frequency and said second cutoff frequency, and at least one of a capacitive circuit configured to be installed between said first resonant circuit and said connection node and an inductive circuit configured to be installed between said second resonant circuit and said connection node, and an antenna, wherein said communication unit modulates a transmission data, converts into a transmission wireless signal and sends said transmission wireless signal from said antenna; and a control unit configured to output said transmission data to said communication unit, wherein said antenna receives a reception wireless signal as said input signal, said band pass filter circuit passes said passband with respect to said input frequency corresponding to said reception wireless signal, and said communication unit demodulates said reception wireless signal, converts into a reception data and outputs to said control unit.

BRIEF DESCRIPTION OF THE DRAWINGS

The above and other objects, advantages and features of the present invention will be more apparent from the following description taken in conjunction with the accompanying drawings, in which:

FIG. 9 shows a configuration of a communication device to which the band pass filter circuit according to the present invention is applied.

DETAILED DESCRIPTION OF PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Embodiments of a band pass filter circuit according to the present invention will be described below with reference to the attached drawings.

Figure 1:
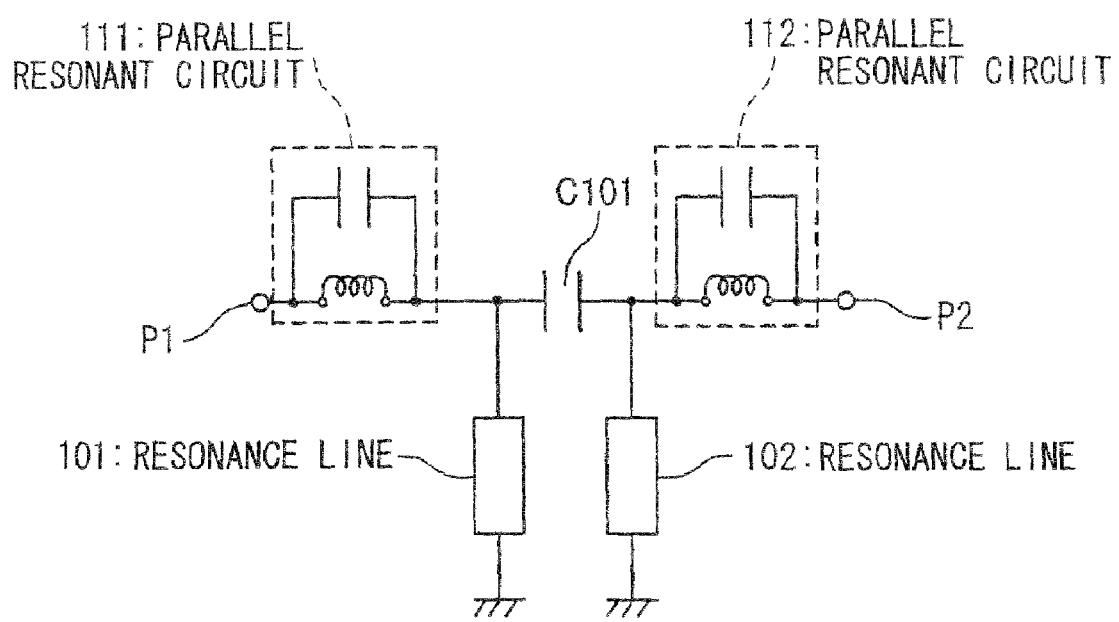
FIG. 1 shows a configuration of a band pass filter circuit disclosed in a related art.
Figure 2:
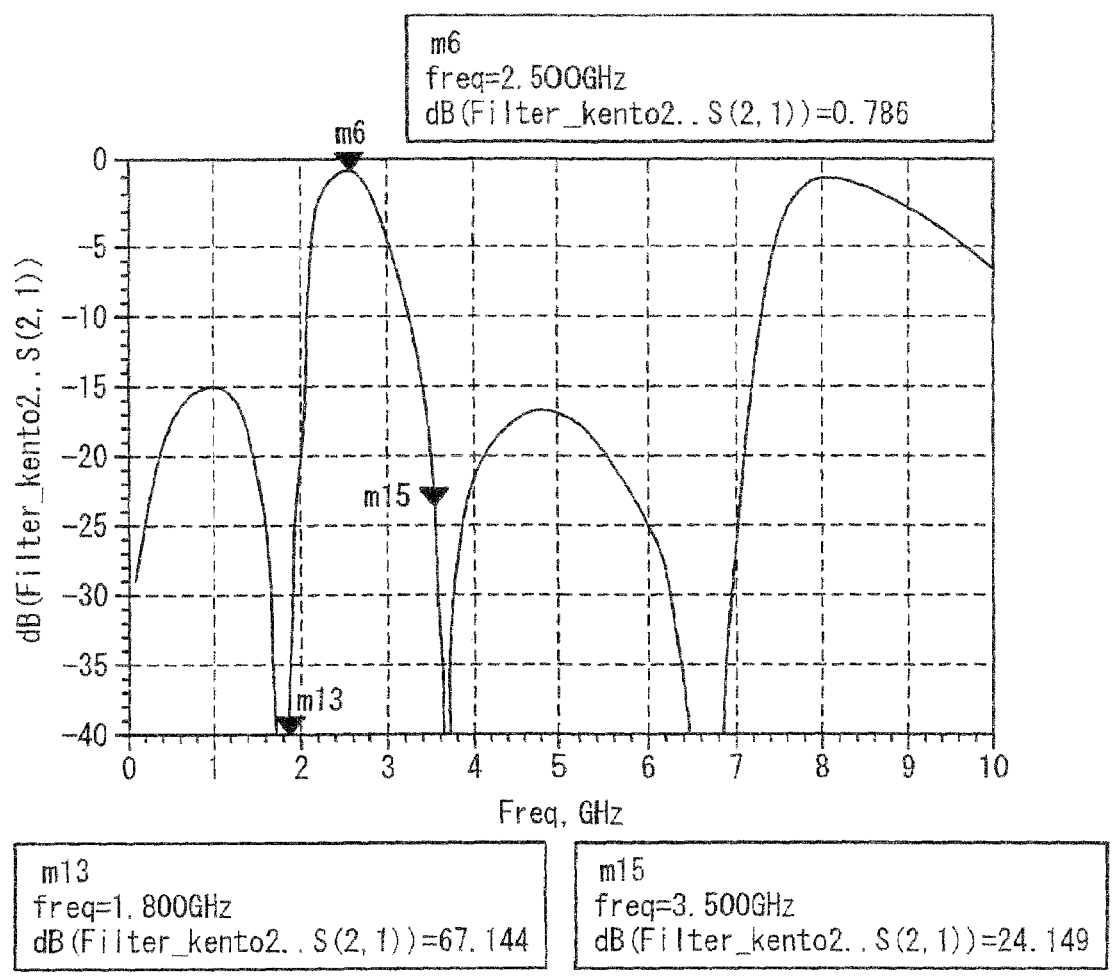
FIG. 2 is a view showing a propagation characteristic of the band pass filter circuit disclosed in a related art.
Figure 3:
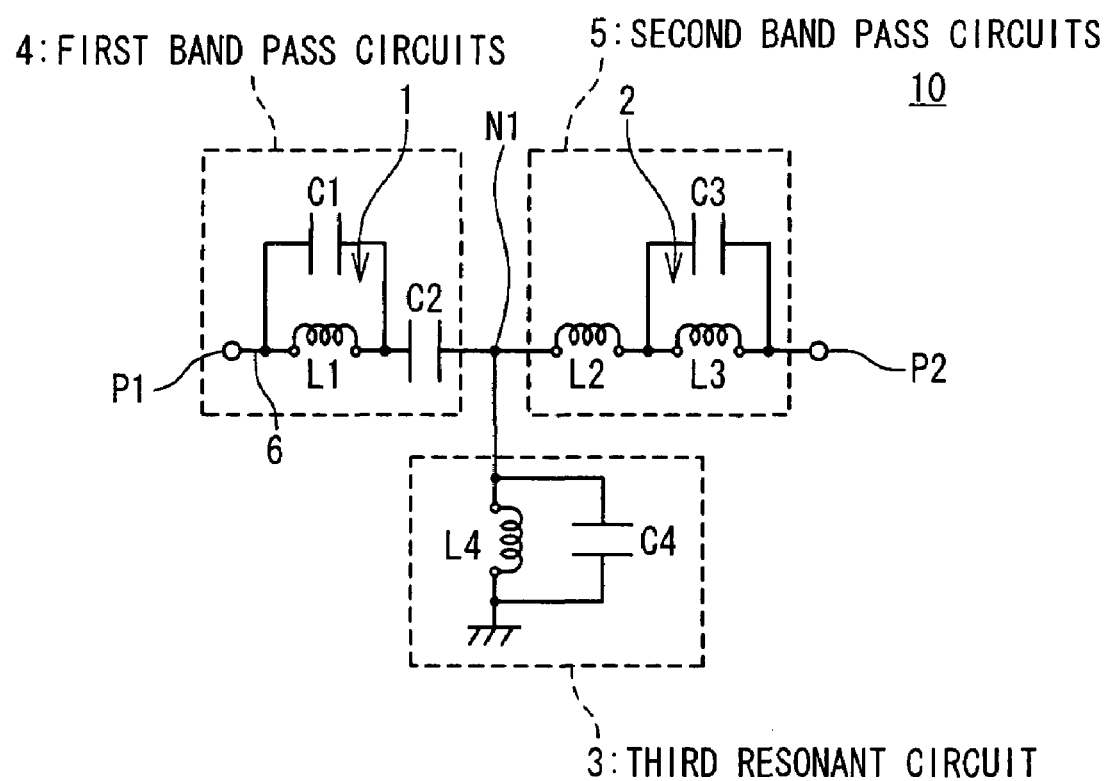
FIG. 3 shows a configuration of a band pass filter circuit according to the present invention.

FIG. 3 shows a configuration of the band pass filter circuit 10 according to the present invention. The band pass filter circuit 10 includes a first band pass circuits 4, a second band pass circuits 5 and a third resonant circuit 3.

The first and second band pass circuits 4, 5 are installed between a first port P1 serving as an input end and a second port P2 serving as an output end, on a signal line 6. That is, these first and second band pass circuits 4, 5 are connected in series to the signal line 6.

The third resonant circuit 3 is connected in parallel to the signal line 6, from a connection node N1 where the first band pass circuit 4 and the second band pass circuit 5 are connected on the signal line 6.

The first band pass circuit 4 includes a first resonant circuit 1 and a capacitive circuit.

The first resonant circuit 1 is a first LC parallel resonant circuit. Hereafter, this is also referred to as a first LC parallel resonant circuit 1. The first LC parallel resonant circuit 1 is installed between the first port P1 and the connection node N1 on the signal line 6 and has an inductor L1 and a capacitor C1 which are connected in parallel in order to set a first resonant frequency.

The capacitive circuit is installed between the first LC parallel resonant circuit 1 and the connection node N1 on the signal line 6 and has a capacitor C2 connected in series to the first LC parallel resonant circuit 1.

The second band pass circuit 5 includes a second resonant circuit 2 and an inductive circuit.

The second resonant circuit 2 is a second LC parallel resonant circuit. Hereafter, this is also referred to as a second LC parallel resonant circuit 2. The second LC parallel resonant circuit 2 is installed between the connection node N1 and the second port P2 on the signal line 6 and has an inductor L3 and a capacitor C3 that are connected in parallel in order to set a second resonant frequency.

The inductive circuit is installed between the connection node N1 and the second LC parallel resonant circuit 2 on the signal line 6 and has a inductor L2 connected in series to the second LC parallel resonant circuit 2.

The third resonant circuit 3 is a third LC parallel resonant circuit. Hereafter, this is also referred to as a third LC parallel resonant circuit 3. The third LC parallel resonant circuit 3 has an inductor L4 and a capacitor C4 that are connected in parallel in order to set a third resonant frequency. In each of the inductor L4 and the capacitor C4, one end thereof is connected to the connection node N1, and the other thereof is grounded.

The band pass filter circuit 10 passes the passband that is a frequency band between a first cutoff frequency and a second cutoff frequency with respect to an input frequency corresponding to the inputted input signal. This passband is higher than the second cutoff frequency and lower than the first cutoff frequency. Therefore, the first cutoff frequency and the second cutoff frequency are referred to as a higher cutoff frequency and a lower cutoff frequency, respectively, which are regarded as the frequencies in which high isolations are required.

As the higher cutoff frequency, the lower cutoff frequency and the band-pass center frequency, the first resonant frequency, the second resonant frequency and the third resonant frequency are set in the first band pass circuit 4, the second band pass circuit 5 and the third LC parallel resonant circuit 3. The band-pass center frequency is the frequency inside the passband between the higher cutoff frequency and the lower cutoff frequency.

For example, the band-pass center frequency is assumed to be 2.5 GHz, the lower cutoff frequency and the higher cutoff frequency are assumed to be 1.8 GHz and 3.5 GHz, respectively, and a characteristic impedance Z0 is assumed to be 50 Ω(ohm).

The first band pass circuit 4 is assumed such that the inductor L1 has a value of 4.0 nH, the capacitor C1 has a value of 0.5 pF, and the capacitor C2 has a value of 0.49 pF.

The second band pass circuit 5 is assumed such that the inductor L2 has a value of 3.5 nH, the inductor L3 has a value of 3.3 nH, and the capacitor C3 has a value of 2.40 pF.

The third LC parallel resonant circuit 3 is assumed such that the inductor L4 has a value of 0.75 nH and the capacitor C4 has a value of 5.27 pF.

In this case, the first resonant frequency is set to 3.5 GHz of the higher cutoff frequency, as the parallel resonant frequency corresponding to the inductor L1 and the capacitor C1.

The second resonant frequency is set to 1.8 GHz of the lower cutoff frequency, as the parallel resonant frequency corresponding to the inductor L3 and the capacitor C3.

The third resonant frequency is set to 2.5 GHz of the band-pass center frequency, as the parallel resonant frequency corresponding to the inductor L4 and the capacitor C4.

Figure 5:
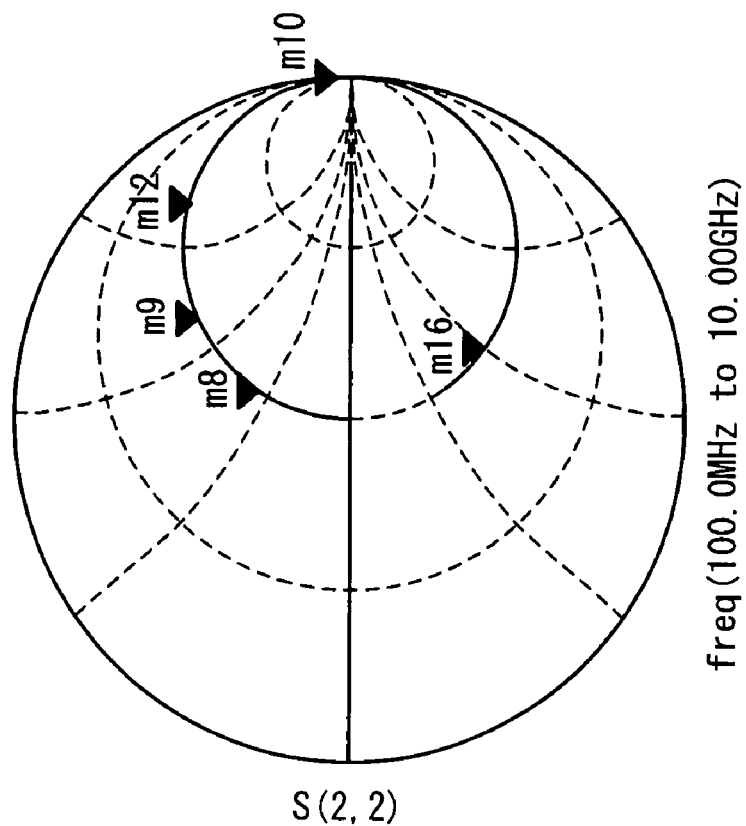
FIG. 5 shows an impedance of a first LC parallel resonant circuit where a higher cutoff frequency of 3.5 GHz is set as a resonant frequency according to the present invention.
Figure 6:
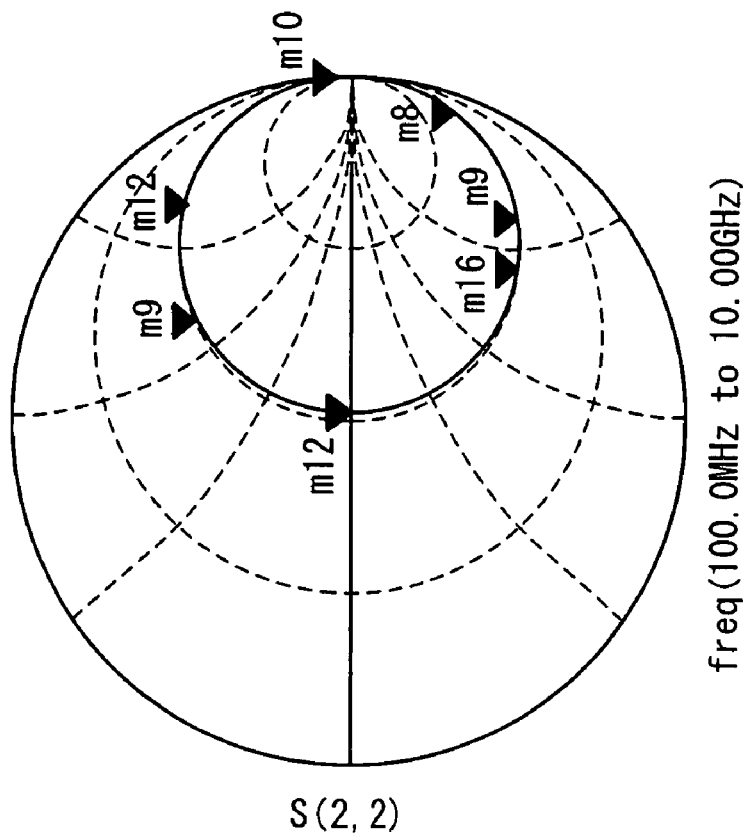
FIG. 6 shows an impedance when a first resonant circuit where a capacitor C2 is connected in series to the first LC parallel resonant circuit is viewed from the side of the capacitor C2 according to the present invention.

FIG. 5 shows the impedance of the first LC parallel resonant circuit 1 where the higher cutoff frequency of 3.5 GHz is set as the resonant frequency. FIG. 6 shows the impedance when the first band pass circuit 4 where the capacitor C2 is connected in series to the first LC parallel resonant circuit 1 is viewed from the side of the capacitor C2. In each of FIGS. 5 and 6, the relation between the a reflection property S(2,2) and an impedance when the frequency is 1 GHz, 1.8 GHz, 2.5 GHz, 3.5 GHz and 8 GHz are represented by markers m8, m9, m12, m10 and m16, respectively. Here, the reflection property S(2,2) is represented by (Reflection electric power of second port P2)/(Input electric power of second port P2) when the input electric power of the first port P1 is assumed to be 0 (zero).

Since the capacitor C2 is connected in series to the first LC parallel resonant circuit 1, for example, the impedance on the low frequency side (here, 1 GHz) indicated by the marker m8 approaches an open point from the vicinity of the characteristic impedance Z0, and the impedance of the band-pass center frequency (2.5 GHz) indicated by the marker m12 approaches the characteristic impedance Z0.

Figure 7:
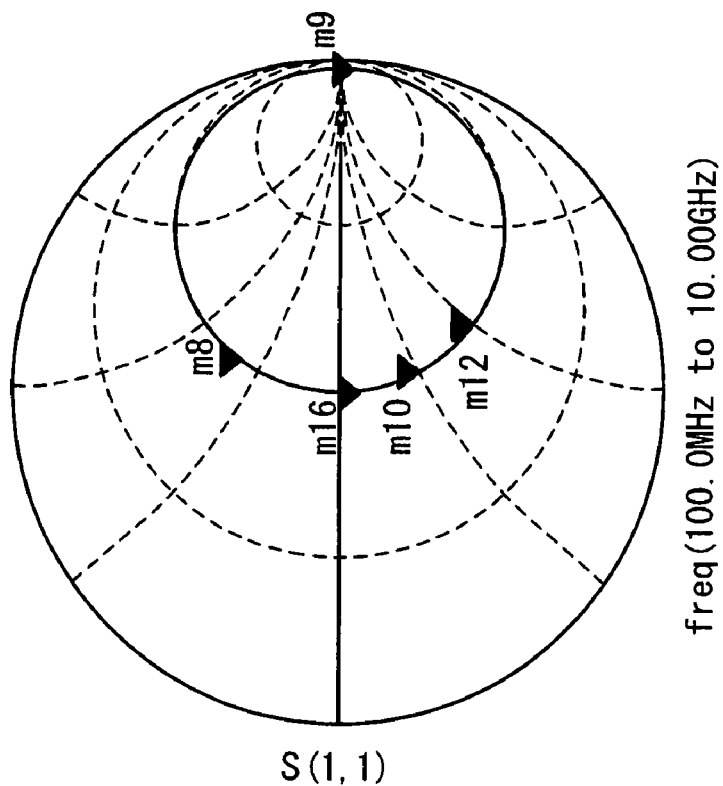
FIG. 7 shows an impedance of a second LC parallel resonant circuit where a lower cutoff frequency of 1.8 GHz is set as a resonant frequency according to the present invention.
Figure 8:
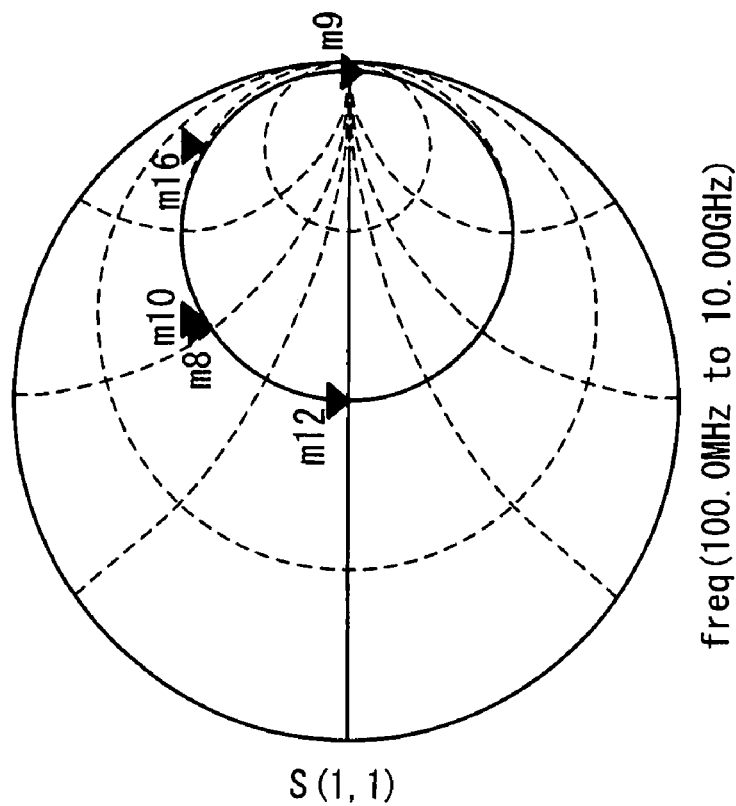
FIG. 8 shows an impedance when a second resonant circuit where an inductor L2 is connected in series to the second LC parallel resonant circuit is viewed from the side of the inductor L2 according to the present invention.

FIG. 7 shows the impedance of the second LC parallel resonant circuit 2 where the lower cutoff frequency of 1.8 GHz is set as the resonant frequency. FIG. 8 shows the impedance when the second band pass circuit 5 where the inductor L2 is connected in series to the second LC parallel resonant circuit 2 is viewed from the side of the inductor L2. Similarly, in each of FIGS. 7 and 8, the relation between a reflection properties S(1,1) and an impedance when the frequency is 1 GHz, 1.8 GHz, 2.5 GHz, 3.5 GHz and 8 GHz is represented by markers m8, m9, m12, m10 and m16, respectively. Here, the reflection property S(1,1) is represented by (Reflection electric power of first port P1)/(Input electric power of first port P1) when the input electric power of the second port P2 is assumed to be 0 (zero).

Since the inductor L2 is connected in series to the second LC parallel resonant circuit 2, for example, the impedance on the high frequency side (here, 8 GHz) indicated by the marker m16 approaches the open point from the vicinity of the characteristic impedance Z0, and the impedance of the band-pass center frequency indicated by the marker m12 approaches the characteristic impedance Z0.

Also, one end of the capacitor C2 and one end of the inductor L2 are connected to the connection node N1. This connection node N1 is grounded through the third LC parallel resonant circuit 3. For this reason, the one end of the capacitor C2 and the one end of the inductor L2 become high impedance so that the reflected signal having the frequency outside the band is grounded. With the foregoing reason, the present invention can obtain the low insertion loss inside the passband and the high isolation characteristic outside the passband.

Figure 4:
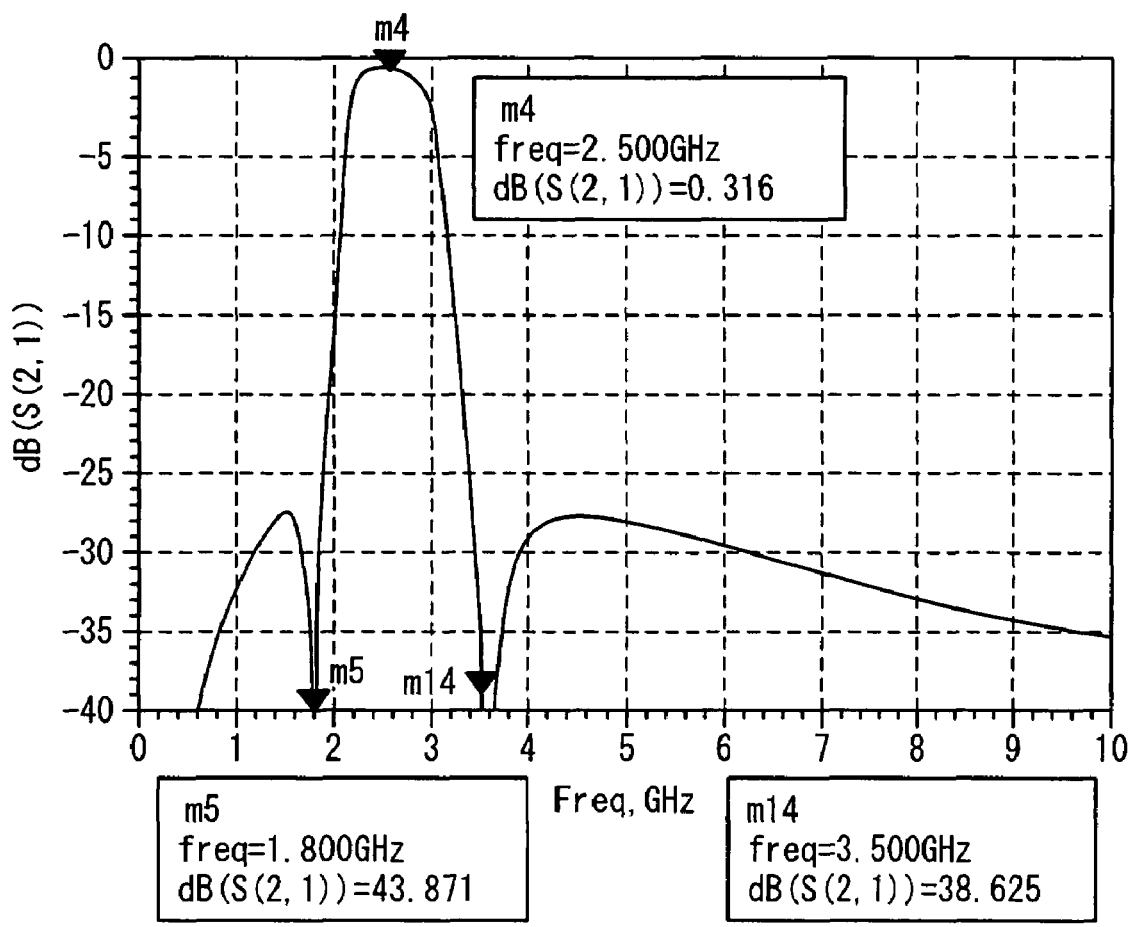
FIG. 4 is a view showing a propagation characteristic of the band pass filter circuit according to the present invention.

FIG. 4 is view showing a propagation characteristic of the-band pass filter circuit 10 according to the present invention. Here, in FIG. 4, the insertion losses dB (S(2,1)) when the frequencies are 1.8 GHz, 2.5 GHz and 3.5 GHz are represented by markers m5, m4 and m14, respectively. The insertion loss dB (S(2,1)) is represented as, for example, −20×log S(2,1) [dB] by using the band-pass characteristics S(2,1). The band-pass characteristics S(2,1) is represented as (Reflection electric power of second port P2)/(Input electric power of first port P1) when the input electric power of the second port P2 is assumed to be 0 (zero).

In the band pass filter circuit 10 according to the present invention, the insertion loss of the band-pass center frequency of 2.5 GHz is 0.32 dB, the insertion loss of the lower cutoff frequency of 1.8 GHz is 43.9 dB, and the insertion loss of the higher cutoff frequency of 3.5 GHz is 38.6 dB. In addition, even in the other frequency bands, the high isolation characteristic of approximately 28 dB or more (−28 dB or less) is obtained.

In this way, according to the band pass filter circuit 10 according to the present invention, the properties of the passband with the low insertion loss and the cutoff frequency band with the high isolation to be required, which is superior to those of the technique in the related art, can be obtained.

FIG. 9 shows a configuration of a communication device 20 to which the bandpass filter circuit 10 according to the present invention is applied. As the communication device 20, a mobile phone, a wireless LAN (Local Area Network) device are exemplified. Hereafter, the communication device 20 is assumed to be the mobile phone. The communication device 20 includes a communicating unit 21, a control unit 22, a microphone 23 and a speaker 24. The control unit 22 is connected to the communicating unit 21, the microphone 23 and the speaker 24. The communicating unit 21 includes the band pass filter circuit 10 and an antenna 26, and the control unit 22 includes a CPU (Central Processing Unit) 25.

For example, a user desires to call another person on his/her telephone terminal. In this case, the user performs a telephone request on the control unit 22.

At this time, the control unit 22 receives voice of the user as voice for transmission from the microphone 23 and generates the transmission voice data indicating the voice for transmission. The control unit 22 outputs the transmission data including the transmission voice data to the communicating unit 21. The communicating unit 21 modulates the transmission data outputted by the control unit 22, converts into a transmission wireless signal and sends it from the antenna 26.

Also, a reception wireless signal serving as the input signal is received by the antenna 26 in the communicating unit 21. The band pass filter circuit 10 of the communicating unit 21 passes the passband with respect to the input frequency corresponding to the reception wireless signal. At this time, the frequency component caused by the noise and the interference is removed. The communicating unit 21 demodulates the reception wireless signal, converts into a reception data and outputs to the control unit 22. The control unit 22 receives the reception data outputted by the communicating unit 21. The reception data includes a reception voice data indicating a reception voice, and the control unit 22 outputs the reception voice indicated by the reception voice data to the speaker 24.

As explained above, according to the band pass filter circuit 10 of the present invention, the properties of the passband with the low insertion loss and the cutoff frequency band with the high isolation to be required can be obtained. Thus, since the communication device includes the band pass filter circuit according to the present invention, the frequency component caused by the noise and the interference can be removed over that of the technique in the related art.

Incidentally, the band pass filter circuit 10 according to the present invention can attain the foregoing effects by including any of the capacitive circuit C2, the inductive circuit L2, and both of the capacitive circuit C2 and the inductive circuit L2.

That is, although the first band pass circuit 4 includes the capacitive circuit C2, the second band pass circuit 5 may not include the inductive circuit L2.

Or, although the second band pass circuit 5 includes the inductive circuit L2, the first band pass circuit 4 may not include the capacitive circuit C2.

Also, as mentioned above, the first band pass circuit 4 and the second band pass circuit 5 may include the capacitive circuit C2 and the inductive circuit L2, respectively.

As mentioned above, according to the band pass filter circuit of the present invention, the properties of the passband with the low insertion loss and the cutoff frequency band with the high isolation to be required can be made superior to those of the technique in the related art.

For this reason, in the communication device, the installation of the band pass filter circuit of the present invention enables the frequency component caused by the noise and the interference to be removed over that of the technique in the related art.

It is apparent that the present invention is not limited to the above embodiment, but may be modified and changed without departing from the scope and spirit of the invention.

What is claimed is:

1. A band pass filter circuit, wherein said band pass filter passes a passband which is a frequency band between a first cutoff frequency and a second cutoff frequency with respect to an input frequency of an inputted input signal, said band pass filter circuit comprising:
a first resonant circuit configured to be connected to a signal line in series and set a first resonant frequency as said first cutoff frequency;
a second resonant circuit configured to be connected to said signal line in series and set a second resonant frequency as said second cutoff frequency;
a third resonant circuit configured to be connected to said signal line in parallel at a connection node where said first resonant circuit and said second resonant circuit are connected, and set a third resonant frequency as a band-pass center frequency between said first cutoff frequency and said second cutoff frequency; and
at least one of a capacitive circuit configured to be installed between said first resonant circuit and said connection node and an inductive circuit configured to be installed between said second resonant circuit and said connection node.

2. The band pass filter circuit according to claim 1, wherein said first resonant circuit includes:
a first inductor and a first capacitor configured to be installed between a first port and said connection node on said signal line, and be connected to each other in parallel so as to set said first resonant frequency,
wherein said second resonant circuit includes:
a second inductor and a second capacitor configured to be installed between a second port and said connection node on said signal line, and be connected to each other in parallel so as to set said second resonant frequency, and
wherein said third resonant circuit includes:
a third inductor and a third capacitor configured to be connected to each other in parallel so as to set said third resonant frequency.

3. The band pass filter circuit according to claim 1, wherein said capacitive circuit includes:
a fourth capacitor configured to be connected to said first resonant circuit on said signal line in series, and
wherein said inductive circuit includes:
a fourth inductor configured to be connected to said second resonant circuit on said signal line in series.

4. The band pass filter circuit according to claim 2, wherein said capacitive circuit includes:
a fourth capacitor configured to be connected to said first resonant circuit on said signal line in series, and
wherein said inductive circuit includes:
a fourth inductor configured to be connected to said second resonant circuit on said signal line in series.

5. The band pass filter circuit according to claim 1, wherein said third resonant circuit is connected to said connection node at one end, and is grounded at another end.

6. The band pass filter circuit according to claim 2, wherein said third resonant circuit is connected to said connection node at one end, and is grounded at another end.

7. The band pass filter circuit according to claim 3, wherein said third resonant circuit is connected to said connection node at one end, and is grounded at another end.

8. The band pass filter circuit according to claim 4, wherein said third resonant circuit is connected to said connection node at one end, and is grounded at another end.

9. A communication device comprising:
a communication unit configured to includes:
a band pass filter circuit configured to pass a passband which is a frequency band between a first cutoff frequency and a second cutoff frequency with respect to an input frequency of an inputted input signal, and include:
a first resonant circuit configured to be connected to a signal line in series and set a first resonant frequency as said first cutoff frequency,
a second resonant circuit configured to be connected to said signal line in series and set a second resonant frequency as said second cutoff frequency,
a third resonant circuit configured to be connected to said signal line in parallel at a connection node where said first resonant circuit and said second resonant circuit are connected, and set a third resonant frequency as a band-pass center frequency between said first cutoff frequency and said second cutoff frequency, and at least one of a capacitive circuit configured to be installed between said first resonant circuit and said connection node and an inductive circuit configured to be installed between said second resonant circuit and said connection node, and an antenna, wherein said communication unit modulates a transmission data, converts into a transmission wireless signal and sends said transmission wireless signal from said antenna; and a control unit configured to output said transmission data to said communication unit, wherein said antenna receives a reception wireless signal as said input signal, said band pass filter circuit passes said passband with respect to said input frequency corresponding to said reception wireless signal, and said communication unit demodulates said reception wireless signal, converts into a reception data and outputs to said control unit.

10. The communication device according to claim 9, further comprising:

a microphone; and a speaker, wherein said control unit generates a transmission voice data indicating voice for transmission inputted through said microphone, and outputs said transmission data including said transmission voice data to said communication unit, said reception data includes a reception voice data indicating reception voice, and said control unit receives said reception data from said communication unit, and outputs said reception voice indicated by said reception voice data included in said reception data to said speaker.

11. The communication device according to claim 9, wherein said first resonant circuit includes:

a first inductor and a first capacitor configured to be installed between a first port and said connection node on said signal line, and be connected to each other in parallel so as to set said first resonant frequency, wherein said second resonant circuit includes:

a second inductor and a second capacitor configured to be installed between a second port and said connection node on said signal line, and be connected to each other in parallel so as to set said second resonant frequency, and wherein said third resonant circuit includes:

a third inductor and a third capacitor configured to be connected to each other in parallel so as to set said third resonant frequency.

12. The communication device according to claim 9, wherein said capacitive circuit includes:

a fourth capacitor configured to be connected to said first resonant circuit on said signal line in series, and wherein said inductive circuit includes:

a fourth inductor configured to be connected to said second resonant circuit on said signal line in series.

13. The communication device according to claim 11, wherein said capacitive circuit includes:

a fourth capacitor configured to be connected to said first resonant circuit on said signal line in series, and wherein said inductive circuit includes:

a fourth inductor configured to be connected to said second resonant circuit on said signal line in series.

14. The communication device according to claim 9, wherein said third resonant circuit is connected to said connection node at one end, and is grounded at another end.

15. The communication device according to claim 11, wherein said third resonant circuit is connected to said connection node at one end, and is grounded at another end.

16. The communication device according to claim 12, wherein said third resonant circuit is connected to said connection node at one end, and is grounded at another end.

17. The communication device according to claim 13, wherein said third resonant circuit is connected to said connection node at one end, and is grounded at another end.

* * * * *